United States Patent
Brune et al.

(10) Patent No.: US 8,468,384 B2
(45) Date of Patent: *Jun. 18, 2013

(54) METHOD AND APPARATUS FOR DEALING WITH WRITE ERRORS WHEN WRITING INFORMATION DATA INTO MEMORY DEVICES

(71) Applicant: Thomson Licensing, Issy-les-Moulineaux (FR)

(72) Inventors: Thomas Brune, Hannover (DE); Michael Drexler, Gehrden (DE); Dieter Haupt, Lueneburg (DE)

(73) Assignee: Thomson Licensing, Issy les Moulineaux (FR)

( * ) Notice: Subject to any disclaimer, the term of this patent is extended or adjusted under 35 U.S.C. 154(b) by 0 days.

This patent is subject to a terminal disclaimer.

(21) Appl. No.: 13/672,122

(22) Filed: Nov. 8, 2012

(65) Prior Publication Data

US 2013/0067272 A1    Mar. 14, 2013

Related U.S. Application Data

(63) Continuation of application No. 12/819,432, filed on Jun. 21, 2010, now Pat. No. 8,352,780.

(30) Foreign Application Priority Data

Jun. 29, 2009   (EP) ..................................... 09305611

(51) Int. Cl.
   *G06F 11/00*       (2006.01)
(52) U.S. Cl.
   USPC .......... 714/6.11; 711/103; 714/6.1; 714/6.12; 714/6.13; 714/6.2

(58) Field of Classification Search
   USPC .................. 711/103; 714/6.1, 6.11, 6.13, 6.2, 714/6.12
   See application file for complete search history.

(56) References Cited

U.S. PATENT DOCUMENTS

| | | | | |
|---|---|---|---|---|
| 4,694,454 A | * | 9/1987 | Matsuura | 714/6.1 |
| 2009/0037652 A1 | | 2/2009 | Yu et al. | |
| 2009/0043948 A1 | * | 2/2009 | Wittenburg et al. | 711/103 |
| 2009/0083591 A1 | * | 3/2009 | Brune et al. | 714/718 |

FOREIGN PATENT DOCUMENTS

| | | |
|---|---|---|
| WO | 2006108755 A1 | 10/2006 |
| WO | 2007080031 A1 | 7/2007 |

OTHER PUBLICATIONS

European Search Report dated Dec. 3, 2009 for EP 09305611.

* cited by examiner

*Primary Examiner* — Joshua P Lottich
(74) *Attorney, Agent, or Firm* — Tutunjian & Bitetto, P.C.

(57) ABSTRACT

For writing, flash memory devices are physically accessed in a page-oriented mode, but such devices are not error-free in operation. According to the invention, when writing information data in a bus write cycle in a sequential manner into flash memory devices assigned to a common data bus, at least one of said flash memory devices is not fed for storage with a current section of said information data. In case an error is occurring while writing a current information data section into a page of a current one of said flash memory devices, said current information data section is written into a non-flash memory. During the following bus write cycle, while the flash memory device containing that defective page is normally idle, that idle time period is used for copying the corresponding stored section of said information data from said non-flash memory to a non-defect page of that flash memory device.

10 Claims, 4 Drawing Sheets

METHOD AND APPARATUS FOR DEALING WITH WRITE ERRORS WHEN WRITING INFORMATION DATA INTO MEMORY DEVICES

CROSS REFERENCE TO RELATED APPLICATIONS

This application is a Continuation of co-pending U.S. patent application Ser. No. 12/819,432 filed on Jun. 21, 2010, which is incorporated herein by reference in its entirety, and which application claims the benefit, under 35 U.S.C. 119 of European Patent application 09305611.7 filed on Jun. 29, 2009.

FIELD OF THE INVENTION

The invention relates to a method and to an apparatus for dealing with write errors when writing information data into flash memory devices, wherein multiple flash memory devices are assigned to a common data bus and in a bus write cycle these flash memory devices are sequentially fed with said information data for storage therein.

BACKGROUND OF THE INVENTION

NAND flash semiconductor devices, as used in storage devices like e.g. the Grass Valley VENOM solid state recorders, are not error-free in operation. For writing, flash memory devices are physically accessed in a page-oriented mode, whereby one 'page' includes e.g. 1024 or 2048 data words and related error correction code. Future flash devices will have a 4096 bytes page size. Erase operations on a specific flash memory can be carried out on specific-size data 'blocks' only. Such data block may include 64 pages.

Some of the memory defects are already detected during production of the storage devices and the corresponding memory locations or pages are marked as 'bad' and not usable. Specific circuitry avoids information data being stored at such 'bad' locations. However, further memory defects will occur during the lifetime and operation of a flash semiconductor. A related processing must prevent that information data intended to be written in such newly defect sections of a flash memory will not be lost. A corresponding processing is described e.g. in WO2007/080031 A1 and in WO2006/108755A1.

SUMMARY OF THE INVENTION

A disadvantage of such processing is that the information data, which was intended to be written to defective areas of a flash memory and which is cached e.g. into an SRAM memory, is to be copied to 'save' areas within the flash memory after the actual recording or take has been finished. This takes some extra time, and the corresponding information is not secured while the information data are not yet stored into the flash memory section of the recording apparatus. Intermediate malfunctions of the recording apparatus, e.g. an operating error or a power-down caused by an empty battery, will lead to information loss. However, such storage malfunctions are not acceptable in a professional storage system.

A problem to be solved by the invention is to deal properly with information data write errors in flash memory devices, such that the error handling occurs during a write cycle for multiple flash memories attached to a common bus. This problem is solved by the method disclosed in claim 1. An apparatus that utilises this method is disclosed in claim 2.

According to the invention, the dynamic defect management is not processed after a recording has been finished but in parallel to that recording.

Advantageously, the required size of the SRAM memory, which stores information data that were initially intended for storage in defect flash memory pages, can be smaller.

Because the I/O data rate of recently commercially available NAND flash devices has been increased with respect to that of previous flash device types, the available bandwidth now remaining can be used for the inventive internal copy process. A save storage of all information data is facilitated, even in case of currently unknown types of defects in flash memory devices. No information will be lost in case of recording apparatus malfunction or a system halt due to low battery status occurring between the beginning of a recording and the end of a take.

In principle, the inventive method is suited for dealing with write errors when writing information data into flash memory devices, wherein two or more flash memory devices are assigned to a common data bus and in a bus write cycle two or more of these flash memory devices are sequentially fed with said information data for storage therein, said method including the steps:

in said bus write cycle, at least one of said flash memory devices is not fed for storage with a current section of said information data;

at least in case an error is occurring while writing a current section of said information data into a page of a current one of said flash memory devices, writing said current section of said information data into a non-flash memory;

during the following bus write cycle, while the flash memory device containing that defective page is normally idle, that idle time period is used for copying the corresponding stored section of said information data from said non-flash memory to an assumed save or non-defect page of that flash memory device.

In principle the inventive apparatus is suited for dealing with write errors when writing information data into flash memory devices, said apparatus including:

at least one common data bus;

two or more flash memory devices and at least one non-flash memory assigned to each one of said data buses, wherein each one of said data buses receives application data via a FIFO device and wherein in a bus write cycle two or more of these flash memory devices per bus are sequentially fed with said information data for storage therein, and wherein in said bus write cycle at least one of said flash memory devices is not fed for storage with a current section of said information data, and wherein at least in case an error is occurring while writing a current section of said information data into a page of a current one of said flash memory devices, said current section of said information data is written into said non-flash memory;

and wherein during the following bus write cycle, while the flash memory device containing that defective page is normally idle, that idle time period is used for copying the corresponding stored section of said information data from said non-flash memory to an assumed save or non-defect page of that flash memory device.

Advantageous additional embodiments of the invention are disclosed in the respective dependent claims.

BRIEF DESCRIPTION OF THE DRAWINGS

Exemplary embodiments of the invention are described with reference to the accompanying drawings, which show in.

DETAILED DESCRIPTION

The write access to known NAND flash memory devices is performed in two steps:

An amount of e.g. 2048 or 4096 bytes (i.e. one 'page') of information data is collected from the I/O pin of a flash memory device and is stored into an internal buffer memory. The content of the internal buffer memory (one page) is copied to the flash memory area.

On one hand, the above copy process is relatively slow, typically 700 μs copy time for one page. On the other hand, the access to the internal buffer memory from the outside of the flash memory device is relatively fast: a bus data rate of 20-40 MB/s for current devices and up to 200 MB/s for next-generation flash memory devices.

Figure 1:
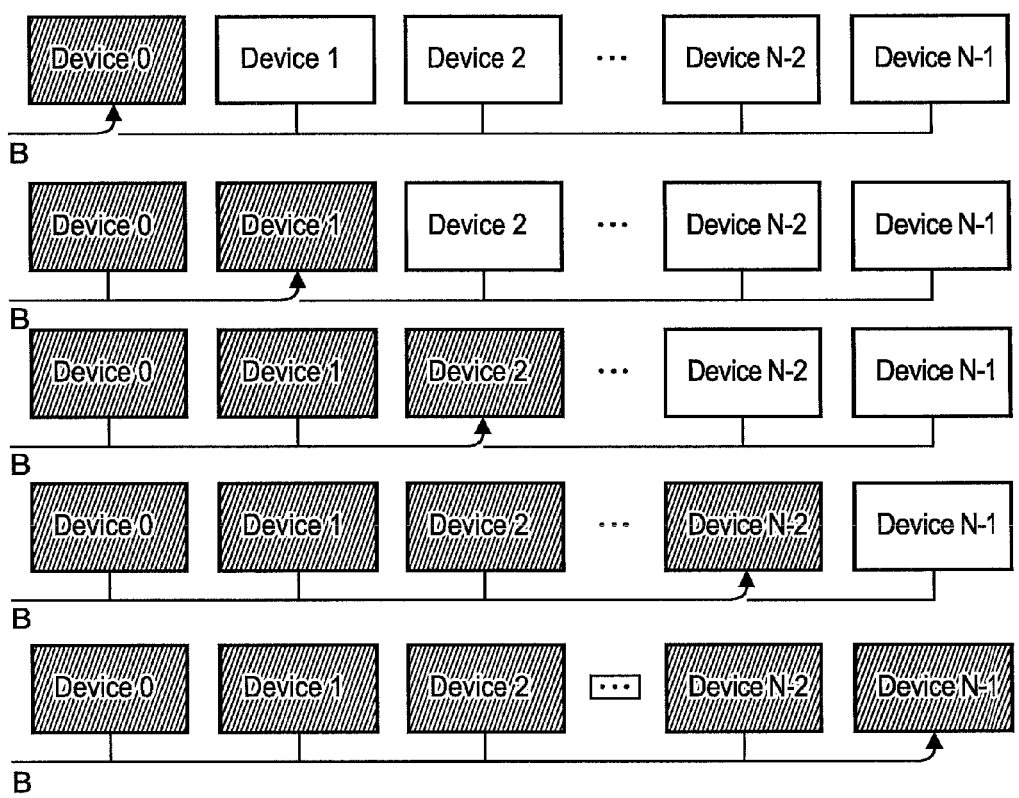
FIG. 1 known memory write cycle on a bus.

For achieving an increased data rate, the NAND flash devices can be arranged in the recording apparatus as a matrix of memories (as depicted in FIG. 1 of WO2007/080031A1 and in FIG. 1 of WO2006/108755A1) that is controlled by several buses, to each bus B of which N NAND flash devices Device0, Device1, Device2, . . . , DeviceN−2, DeviceN−1 are connected, as shown in FIG. 1 of the current application for a single one of the buses. The first row represents a first write period for Device0, the second row represents a second write period for Device1, and so on. The last row represents the last write period for DeviceN−1. The number of NAND flash devices connected to a bus is calculated with respect to the above-mentioned bus data rate and to the above-mentioned copy time, in order to meet the requirements of the application data rate. The writing is performed as an interleaved multiplex. State-of-the-art architectures (e.g. the VENOM FlashPak mentioned above) do not provide bandwidth for additional data transfers in case of write errors.

Figure 2:
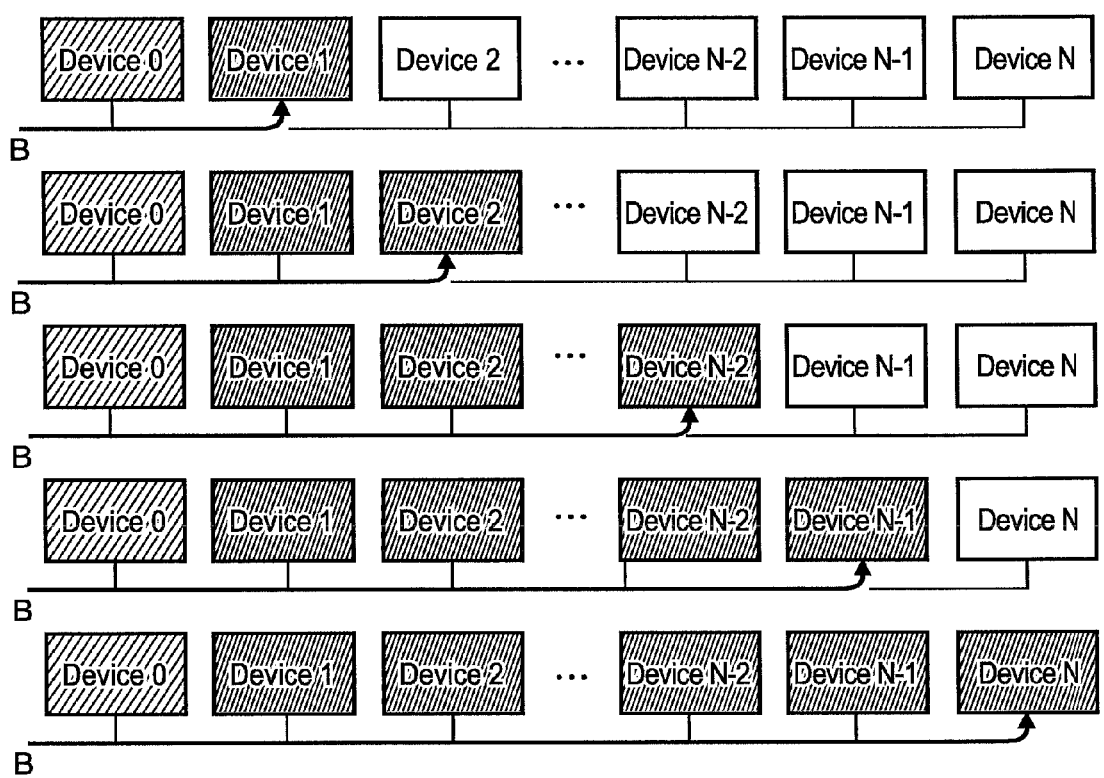
FIG. 2 inventive memory write cycle on a bus, in a first write sequence.

According to the invention, extra bandwidth (with respect to the required application bandwidth) is added by either adding one or more additional flash memory devices to bus or buses B, as shown in FIG. 2, or by using faster flash memory devices. For example, in case N flash memory devices are needed on a bus for fulfilling the original bandwidth requirements, N+1 flash memory devices present on the bus will provide an I/O bandwidth that is increased by a factor of (N+1)/N. This additional bandwidth is used for facilitating the internal copy process from the SRAM memory to the flash devices within the ongoing interleaved multiplex. This extra bandwidth will only be used when flash page write errors will occur. Both, the additional bandwidth for the internal copy process of the flash devices and the interface bandwidth are selected so as to enable the inventive page write error defect management.

Figure 4:
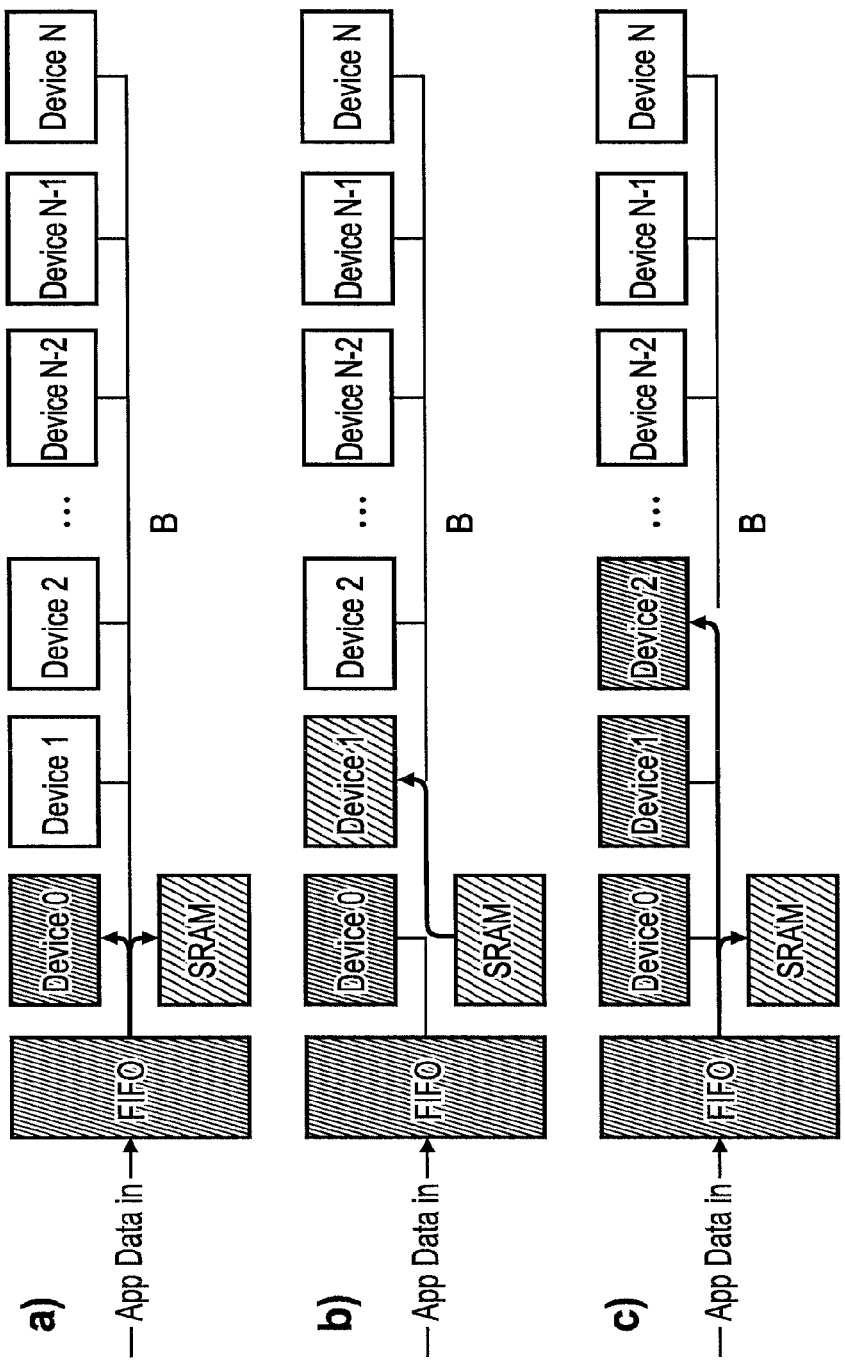
FIG. 4 inventive copy processing.

During an error-free page writing operation period, one flash device—e.g. Device0 in FIG. 2—on bus B is not used for writing within a current write cycle. FIG. 2 shows one write cycle starting with Device1 and ending with DeviceN. The first row represents a first write period for Device1, the second row represents a second write period for Device2, and so on. The last row represents the last write period for DeviceN. During the following write cycle, another one of the flash devices on bus B will not be used in that write cycle but Device0 is used instead in that write cycle. A controller or a corresponding program for a processor, which controller or processor is not depicted:

- controls the write operation into the flash memories Device0 to DeviceN attached to bus B;
- controls which one of the flash memories on bus B is not used in a current bus write cycle;
- checks whether a flash memory on bus B—or any other corresponding status data—has signaled a writing error or a newly defective writing area;
- controls the corresponding information data transfer to and from a non-flash memory attached to bus B as described in connection with FIG. 4.

Figure 3:
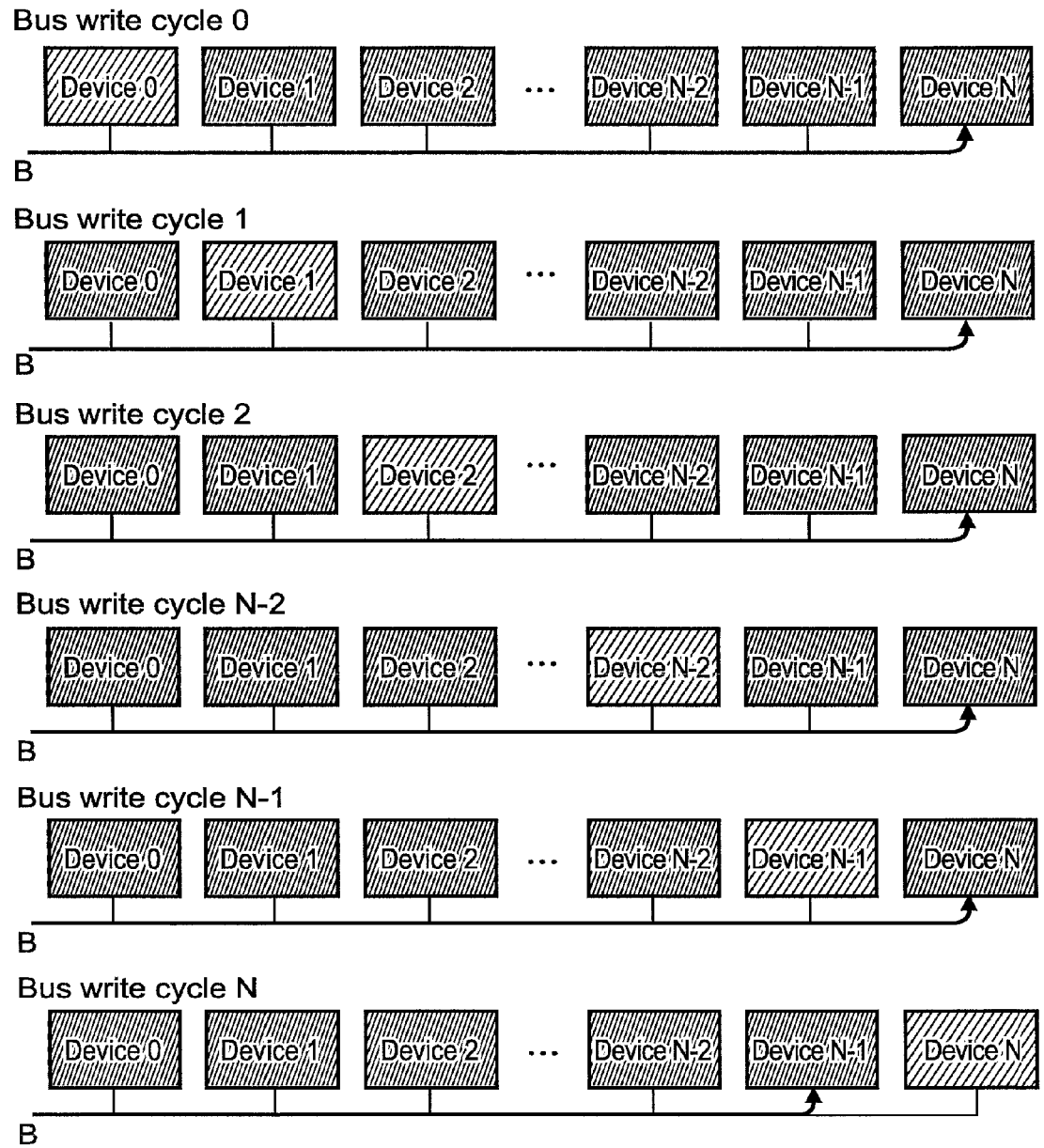
FIG. 3 successive completed bus write cycles with different flash memory being idle.

FIG. 3 depicts a successive sequence of (completed) example bus write cycles, in each of which bus write cycles a different flash device is idle on bus B, starting with Device0 in bus write cycle 0 and ending with DeviceN in. After N+1 write cycles each flash device had been idle bus write cycle N.

In FIG. 4a, in case a writing error in flash memory e.g. Device0 or a newly defective writing area in that flash memory is signaled (by that flash memory), the information data intended for writing into a defective flash page will instead be temporally stored in a non-flash memory, e.g. an SRAM memory. As an alternative, the page information data written into a current flash memory is in parallel also written into the SRAM memory while the previously stored information data in the SRAM memory is deleted or overwritten at the appropriate time, which means that the storage capacity of the SRAM memory needs to be larger than in the other embodiment.

During the following bus write cycle, while the flash memory device containing that defective page is normally idle, that idle time period is used for initialising and carrying out a copy operation from the SRAM memory to an assumed save or non-defective flash page of that flash memory device, as shown in FIG. 4b. Thereafter the processing continues in the normal way, as depicted in FIG. 4c. The FIFO arranged at the input of bus B is used for compensating the factor (N+1)/N-increased data rate on flash bus B.

In most cases, three or more flash memory devices Device0, Device1, . . . , DeviceN−1 are assigned or connected to the common data bus B, and in a bus write cycle two or more of these flash memory devices are sequentially fed with the information data for storage therein. Within a cache memory device, in a first step the information data are written into the internal cache memory section of the flash device and in a second step are transferred or programmed from that cache memory to the flash memory kernel.

However, in case a 'cache mode' is used for the flash memories, the flash memory device allows to write the information data into the cache memory section of the flash device while the previously received information data are programmed (i.e. stored) from the cache memory into the flash memory kernel (the flash memory device has two cache memory sections or two cache memories). In such 'cache mode' operation, at least two flash memory devices Device0, Device1, . . . , DeviceN−1 are assigned or connected to the common data bus B.

What is claimed is:

1. A method for dealing with write errors when writing information data into two or more memory devices, wherein said two or more memory devices are assigned to a common data bus and in a bus write cycle the two or more memory devices are sequentially fed with said information data for storage therein, said method comprising the steps:

- in a current bus write cycle, at least one of said two or more memory devices is not fed for storage with a current section of said information data;
- at least in case an error is occurring while writing a current section of said information data into a page of a current one of said memory devices, writing said current section of said information data into an additional memory;
- during the following bus write cycle, while a current memory device containing that defective page is normally idle and said writing of said information data into other memory devices is ongoing, using that idle time period for copying a corresponding stored section of said information data from said additional memory to an assumed save or non-defect page of the current memory device.

2. The method according to claim 1, wherein in each one of successive bus write cycles a different one of said two or more memory devices on said bus is not fed for storage with a current section of said information data.

3. The method according to claim 1, wherein said additional memory is an SRAM memory.

4. The method according to claim 1, wherein said two or more memory devices are operating in a cache mode.

5. The method according to claim 1, wherein said two or more memory devices are not operating in a cache mode and wherein three or more memory devices are assigned to said common data bus.

6. An apparatus for dealing with write errors when writing information data into memory devices, said apparatus comprising:

- at least one common data bus that receives application data via FIFO device;
- two or more memory devices and at least one additional memory assigned to each one of said data buses,
- wherein in a bus write cycle said two or more memory devices per bus are sequentially fed with said information data for storage therein,
- wherein in a current bus write cycle at least one of said memory devices is not fed for storage with a current section of said information data, and wherein in case an error is occurring while writing a current section of said information data into a page of a current one of said two or more memory devices, said current section of said information data is written into said additional memory; and
- wherein during the following bus write cycle, while said current memory device containing that defective page is normally idle and said writing of said information data into other memory devices is ongoing, that idle time period is used for copying the corresponding stored section of said information data from said additional memory to an assumed save or non-defect page of said current memory device.

7. The apparatus according to claim 6, wherein in each one of successive bus write cycles a different one of said two or more memory devices on said bus is not fed for storage with a current section of said information data.

8. The apparatus according to claim 6, wherein said additional memory is an SRAM memory.

9. The apparatus according to claim 6, wherein said two or more memory devices are operating in a cache mode.

10. The apparatus according to claim 6, wherein said two or more memory devices are not operating in a cache mode and wherein three or more memory devices are assigned to said common data bus.

* * * * *